United States Patent [19]

Liu

[11] Patent Number: 5,596,289

[45] Date of Patent: Jan. 21, 1997

[54] DIFFERENTIAL-DIFFERENCE CURRENT CONVEYOR AND APPLICATIONS THEREFOR

[75] Inventor: Shen-Iuan Liu, Keelung, Taiwan

[73] Assignee: National Science Council, Taipei, Taiwan

[21] Appl. No.: 440,931

[22] Filed: May 15, 1995

[51] Int. Cl.$^6$ .............................. H03K 5/22; H03F 3/45
[52] U.S. Cl. ........................... 327/67; 327/345; 327/558; 327/563; 330/253; 330/260
[58] Field of Search ..................... 330/253, 257, 330/260, 311; 327/63, 65, 68, 52, 53, 54, 69, 437, 336, 345, 66, 108, 67, 558, 563

[56] References Cited

U.S. PATENT DOCUMENTS

| | | | |
|---|---|---|---|
| 4,228,366 | 10/1980 | Hüttemann et al. | 327/336 |
| 4,338,527 | 7/1982 | Nagano | 327/361 |
| 4,929,908 | 5/1990 | Imanishi | 330/254 |
| 5,130,666 | 7/1992 | Nicollini | 330/253 |
| 5,196,742 | 3/1993 | McDonald | 327/544 |
| 5,394,026 | 2/1995 | Yu et al. | 327/536 |

Primary Examiner—Timothy P. Callahan
Assistant Examiner—Terry L. Englund
Attorney, Agent, or Firm—Sughrue, Mion, Zinn, Macpeak & Seas

[57] ABSTRACT

A differential-difference current conveyor combines features of a differential-difference amplifier and a current conveyor. The differential-difference current conveyor receives four input signals (1, 2, 3, X) and outputs one output signal Z. There is a defined relationship of voltages and currents, wherein $V_X=V_1-V_2+V_3$; $I_1=I_2=I_3=0$; and $I_X=I_Z$. The differential-difference current conveyor has a first differential pair, in which a non-inverting input terminal and an inverting input terminal are coupled to the third and second input signals, respectively; a second differential pair, in which a non-inverting input terminal and an inverting input terminal are coupled to the first and fourth input signals, respectively, and a non-inverting output terminal and an inverting output terminal of the second differential pair are connected to an inverting output terminal and a non-inverting output terminal of the first differential pair, respectively; a load connected between a high voltage source and a joint terminal of the output terminals of the first and second differential pairs; a negative feedback circuit, connected to the non-inverting output terminal of the second differential pair and the non-inverting input terminal of the second differential pair; and a tracking circuit for tracking a current value from the fourth input signal to the output signal, which is connected between the high voltage source and the low voltage source.

15 Claims, 4 Drawing Sheets

DIFFERENTIAL-DIFFERENCE CURRENT CONVEYOR AND APPLICATIONS THEREFOR

BACKGROUND OF THE INVENTION

The present invention is related to a type of integrated circuit. Note specifically, the present invention is related to a differential-difference current conveyor using MOS devices and to applications of the differential-difference current conveyor, such as a filter circuit or an integrator circuit.

The differential-difference amplifier, widely used in op-amp circuits, is a fundamental amplifier circuit applied to integrated circuits. The differential-difference amplifier, formed by at least two BJT or MOS differential pairs, has several advantages, such as a reduction of the number of passive devices requiring matching, and a simplified design process.

In view of current technology, the conventional differential-difference amplifier still has many drawbacks and requires further improvement. First, like the conventional op-amp circuit, performance of the differential-difference amplifier is limited by its finite gain-bandwidth product, so that it is unsuitable for application in high frequency circuits. In addition, in an integrator circuit formed by the differential-difference amplifier, it is necessary to float a resistor or capacitor, which produces instability when incorporated into an integrated circuit.

However, a device called a current conveyor is quite appropriate for use in high-frequency circuits. The principle and performance of the current conveyor have been disclosed in U.S. Pat. No. 5,124,666.

In view of the disadvantages of the conventional technology described above, we provide a novel device, a differential-difference current conveyor, to solve these problems. The first object of the present invention is to provide a device, which has a superior finite gain-bandwidth product, and as a result, is appropriate for application in high frequency circuits.

The second object of the present invention is the use of the device as a building block of an integrator circuit, which does not require a floating resistor or capacitor and is well-suited for manufacture as an integrated circuit.

The third object of the present invention is to provide the device as a component in an integrator circuit, which can receive a number of input signals. More explicitly, the integrator circuit conducts a multiple input integration operation.

The fourth object of the present invention is to provide the device in a filter circuit, which has superior frequency response in comparison to prior art filter circuits.

SUMMARY OF THE INVENTION

To achieve these objects, the present invention provides a differential-difference current conveyor which comprises a differential-difference amplifier and a current conveyor. The circuit symbol of this device is shown in FIG. 1. The differential-difference current conveyor receives four input signals (1, 2, 3, X) and outputs one output signal Z. There is a defined relationship of voltages and currents between nodes, as follows:

$$V_x = V_1 - V_2 + V_3 \quad (1)$$

$$I_1 = I_2 = I_3 = 0 \quad (2)$$

$$I_x = I_z \quad (3)$$

For the differential difference current conveyor, it is assumed that the voltage sum of a first input signal and a third input signal is the same as the sum of a second input signal and a fourth signal, and the current of said fourth input signal is equal to that of an output signal. It is also assumed that the current values of said first, second, and third input signals are zero. The differential-difference current conveyor comprises a first differential pair, where a non-inverting input terminal and an inverting input terminal of the first differential pair are coupled to said third and second input signals, respectively; a second differential pair, where a non-inverting input terminal and an inverting input terminal of the second differential pair are coupled to said fourth and first input signals, respectively, and a non-inverting output terminal and an inverting output terminal of said second differential pair are connected to an inverting output terminal and a non-inverting output terminal of said first differential pair, respectively; a load connected between a high voltage source and of the output terminals of said first and second differential pairs; a means for negative feedback connected between the non-inverting output terminal of said second differential pair and the non-inverting input terminal of said second differential pair; and a means for tracking a current value from said fourth input signal to said output signal, which is connected between said high voltage source and said low voltage source.

BRIEF DESCRIPTION OF THE DRAWINGS

The detailed description of an embodiment of the present invention is made with reference to the accompanying drawings, wherein.

DETAILED DESCRIPTION OF PREFERRED EMBODIMENTS

Figures 1, 2:
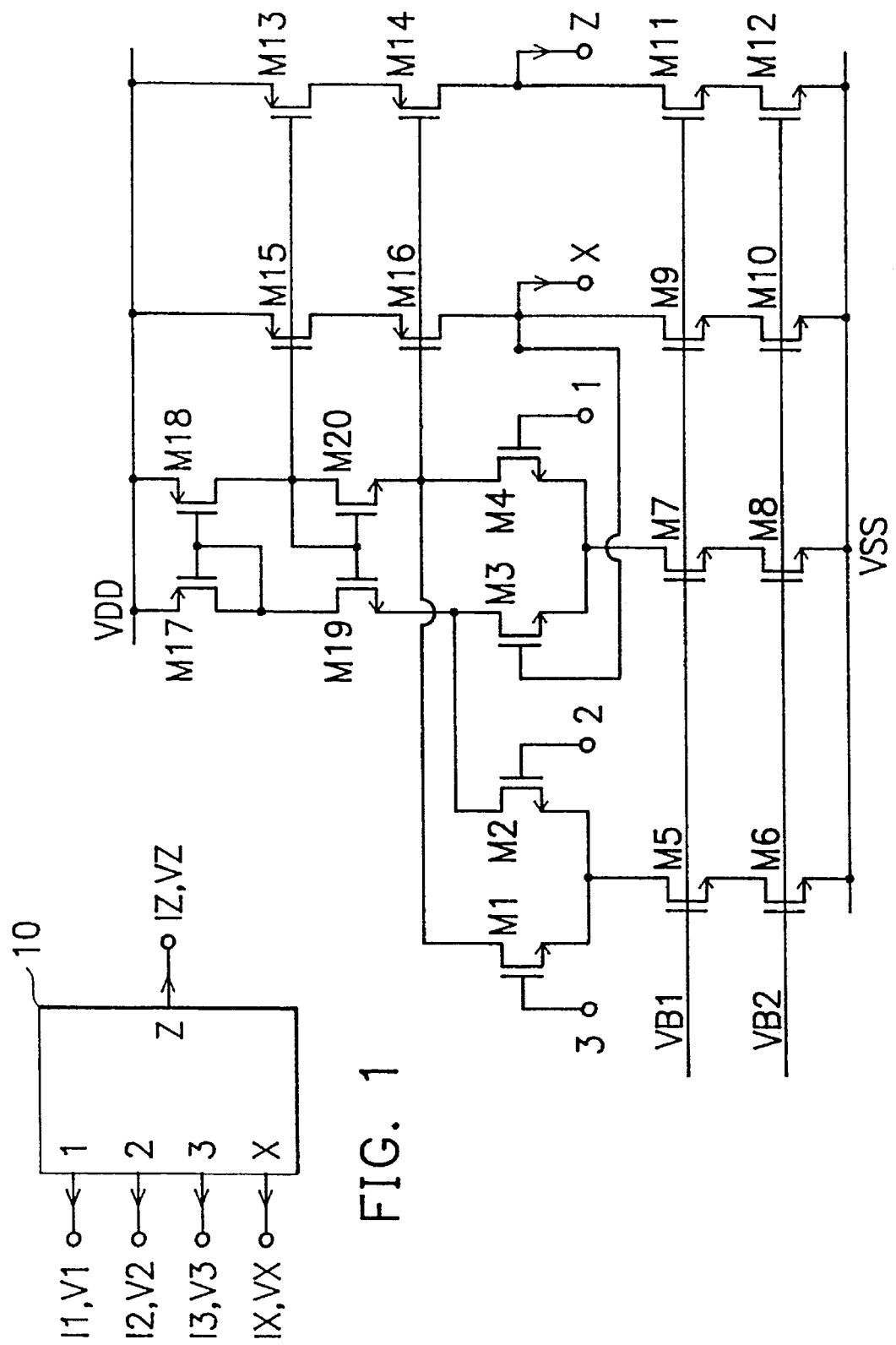
FIG. 1 illustrates a circuit symbol representing a CMOS differential-difference current conveyor of the present invention.
FIG. 2 shows the circuit diagram of a CMOS differential-difference current conveyor of the present invention.

FIG. 2 shows the detailed circuit diagram of a differential-difference current conveyor according to FIG. 1. The MOS transistors M1, M2, M5, and M6 constitute a first differential pair. Gates of the MOS transistors M1 and M2, used as a non-inverting input terminal and an inverting input terminal of the first differential pair, are respectively coupled to the third input signal 3 and the second input signal 2. Further, drains of the MOS transistors M1 and M2 are used as an inverting output terminal and a non-inverting output terminal, respectively. Further, a common source of the MOS transistors M1 and M2 is connected to and supplied from a first current source consisting of the MOS transistors M5 and M6, which are gated by control signals VB1 and VB2, respectively, to control the current value. The MOS transistors M3, M4, M7, and M8 constitute a second differential pair. Similar to the first differential pair, the second differential pair receives the fourth input signal X and the first input signal 1 at gates of the MOS transistors M3, M4 and outputs the inverting and non-inverting output signals. The following table further clarifies the terminal connections above:

|  | received signal | Gate terminal | Drain terminal |
| --- | --- | --- | --- |
| Tx M1 | third input signal 3 | non-inverting input terminal of the first differential pair | inverting output terminal of the first differential pair |
| Tx M2 | second input signal 2 | inverting input terminal of the first differential pair | non-inverting output terminal of the first differential pair |
| Tx M3 | fourth input signal X | non-inverting input terminal of the second differential pair | inverting output terminal of the second differential pair |
| Tx M4 | first input signal 1 | inverting input terminal of the second differential pair | non-inverting output terminal of the second differential pair |

The MOS transistors M17, M18, M19, M20 constitute an active load current mirror, which is of a cascaded type and is used as a load device for the first and second differential pairs. A source of the MOS transistor M19 is coupled to the non-inverting output terminal of the first differential pair and the inverting output terminal of the second differential pair. A source of MOS transistor M20 is coupled to the inverting output terminal of the first differential pair and the non-inverting output terminal of the second differential pair. The MOS transistors M9, M10, M15, and M16 constitute a DC current source, and also a current mirror, wherein the MOS transistor M16 is used as a feedback device and will be explained later in this description. The gate and drain of the MOS transistor M16 are coupled to the non-inverting output terminal and the input terminal of the second differential pair, respectively. The MOS transistors M11, M12, M13, and M14 constitute an output means. A common drain of the MOS transistor M14 and M11 outputs an output signal Z of the differential-difference current conveyor. To avoid the effect of channel length modulation, this embodiment utilizes the structure of the cascaded current mirror.

The operation principles of the embodiment described above are stated hereafter. The MOS transistors M1–M10 and M15–M20 form a negative feedback amplifier. A route of negative feedback is accomplished by the MOS transistor M16, where gate and drain are connected to the non-inverting output and input terminals of the second differential pair, respectively. Since gate and drain voltages of a common MOS transistor are inversely proportional, the voltage $V_X$ of the fourth input signal X can be expressed by the open gain parameter $A_O$, that is, the amplifier gain without feedback, as follows:

$$V_X = A_o[(V_3 - V_2) - (V_X - V_1)] \quad (4)$$

Because the open gain of a differential pair is usually much larger than 1, Equation (4) can be simplified as:

$$V_X = V_3 - V_2 + V_1 \quad (5)$$

We find that Equation (5) is the same as Equation (1), which represents the relationship of voltages of individual terminals in a differential-difference current conveyor.

Clearly, Equation (2), which defines current values of the first input signal 1, the second input signal 2, and the third input signal 3 to be zero, is true. This results from the fact that the gate current of a MOS transistor is almost zero.

On the other hand, based on the characteristics of a current mirror, a current $I_X$ from the fourth input signal 4 is the same as a current $I_Z$ from the output signal Z. This is the relationship expressed by Equation (3).

To investigate the property of a CMOS differential-difference current conveyor, we made a simulation with parameters of the 3 μm p-well process. We found that under the condition of high/low power source $-V_{DD}$ and $V_{SS}$ being ±5 V, the linear operation region of a CMOS differential-difference current conveyor was almost ±4 V, the slew rate was ±10 V/μs while the load capacitor was 5 pF, and the −3 dB frequency response operation was in the region of 10 MHz. The performance of the differential-difference current conveyor is appropriate for high frequency applications.

The differential-difference current conveyor of the present invention can be conveniently applied to various fields, such as filters and integrators.

Figure 3:
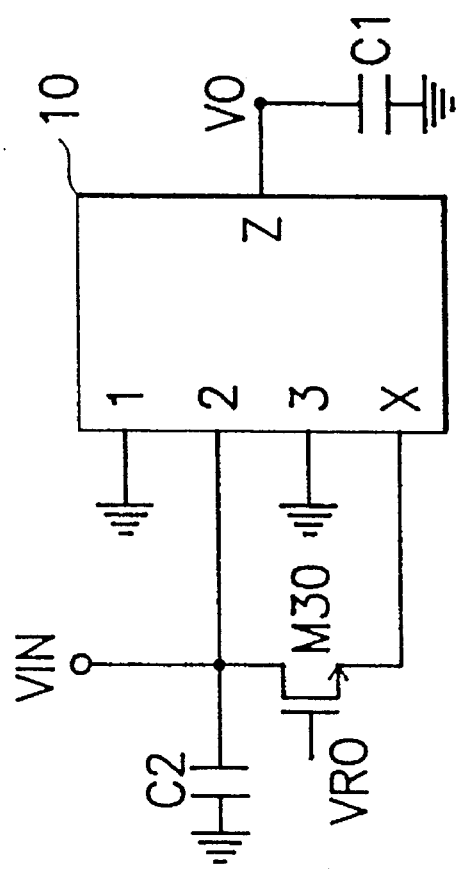
FIG. 3 shows an integrator circuit diagram employing the CMOS differential-difference current conveyor of the present invention.

An integrator using a differential-difference current conveyor is schematically shown in FIG. 3. It comprises a differential-difference current conveyor 10, a linearized MOS transistor M30 and an integrator capacitor C1. The first input terminal 1 and the third input terminal 3 of the differential-difference current conveyor 10 are grounded together. Therefore, based on Equation (1), the voltage of the second input terminal is the negative of the fourth input signal. An input signal VIN is coupled to the second input terminal 2, so the voltage of the fourth input signal is −VIN. Furthermore, the drain-source passage of the MOS transistor M30 is coupled between the second and fourth input terminals 2, X. The gate of the MOS transistor M30 is coupled to a reference voltage VRO. When the reference voltage VRO is greater than the threshold voltage of the MOS transistor M30, the linearized MOS transistor M30 will be operated in the linear region. Capacitors C1 and C2, shown in FIG. 3, are used for storing electric charge and compensating the high frequency effect, respectively.

The drain current of a MOS transistor operated in the linear region is shown as follows:

$$I_D = 2K\left[(V_{GS} - V_T)V_{DS} - \frac{V_{DS}^2}{2}\right] \quad (6)$$

where K is the transconductance parameter of MOS transistor and $V_T$ is the threshold voltage.

Using the relationship of Equation (6), we can obtain $$-I_X = 2K(VRO - V_T)VIN = \frac{VIN}{R_{eq}} \quad (7)$$

where the parameter $R_{eq}$ represents the equivalent resistance. Therefore, we call the MOS transistor M30 a linearized MOS transistor. Referring to Equation (3), the current of signal X is the same as that of signal Z, the output signal. We can obtain from the integration formula the following equation:

$$\frac{V_o}{VIN} = \frac{-1}{s \times R_{eq} \times C1} \qquad (8)$$

The illustrated integrator circuit has several advantages compared with the conventional one used with a differential-difference amplifier. First, this integration circuit requires no floating resistors or capacitors. Furthermore, a compensating capacitor C2 is coupled to the second input signal in order to compensate for the high frequency effect due to the differential-difference current conveyor 10 and the linearized MOS transistor M30.

Figure 4:
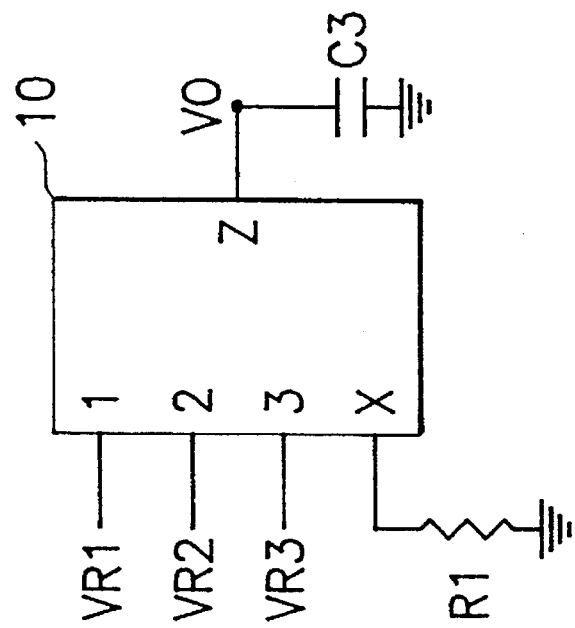
FIG. 4 shows an alternative integrator circuit diagram employing the CMOS differential-difference current conveyor of the present invention.

An integrator of the present invention with a differential-difference current conveyor which receives a plurality of input signals is shown in FIG. 4. It comprises a differential-difference current conveyor 10, a grounding resistor R1 and capacitor C3. The input terminals 1, 2, 3 of the differential-difference current conveyor 10 are coupled to the input signals VR1, VR2 and VR3, respectively. According to Equation (1), the voltage $V_x$ of the fourth output signal X is equal to the voltage $V_1$ subtracted by the voltage $V_2$ and added by the voltage $V_3$. Similar to the integrator illustrated in FIG. 3, we can obtain a multiple-input integrator, which is derived as follows:

$$\frac{V_o}{V_1 - V_2 + V_3} = \frac{1}{s \times R1 \times C3} \qquad (9)$$

From the view of integrator structures based on FIG. 3 and FIG. 4, this invention formed by a differential-difference current conveyor has three advantages. The first is that it requires only a grounding capacitor for integration; the second is that it requires only a grounding resistor or an MOS transistor operated in the linear region; the third is that it can receive a plurality of input signals.

Figure 5:
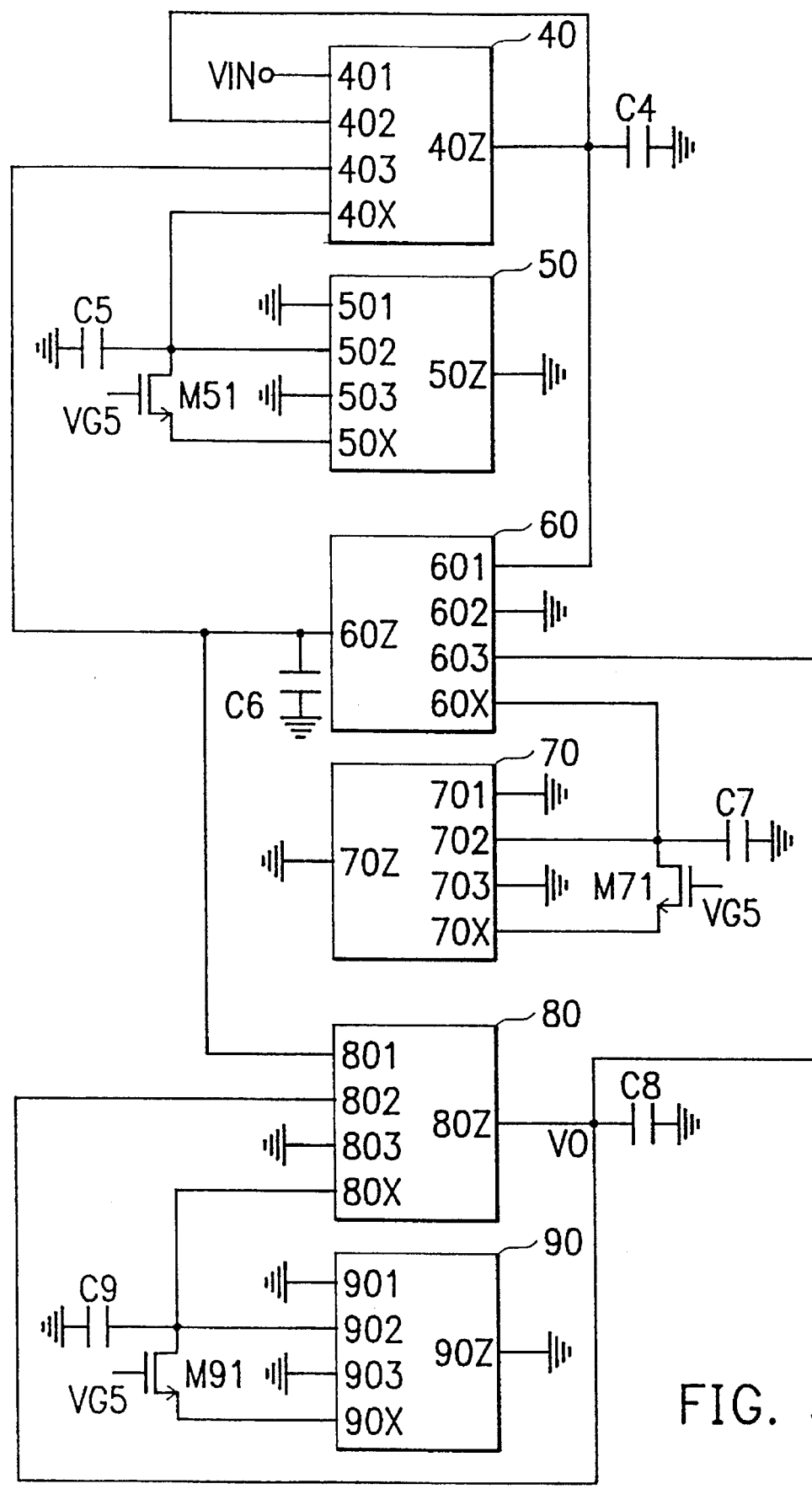
FIG. 5 shows a third-order lowpass filter circuit synthesized by the CMOS differential-difference current conveyor, where the ripple bandwidth is 1.0 MHz, the amplitude fluctuation is 0.1 dB.
Figure 6:
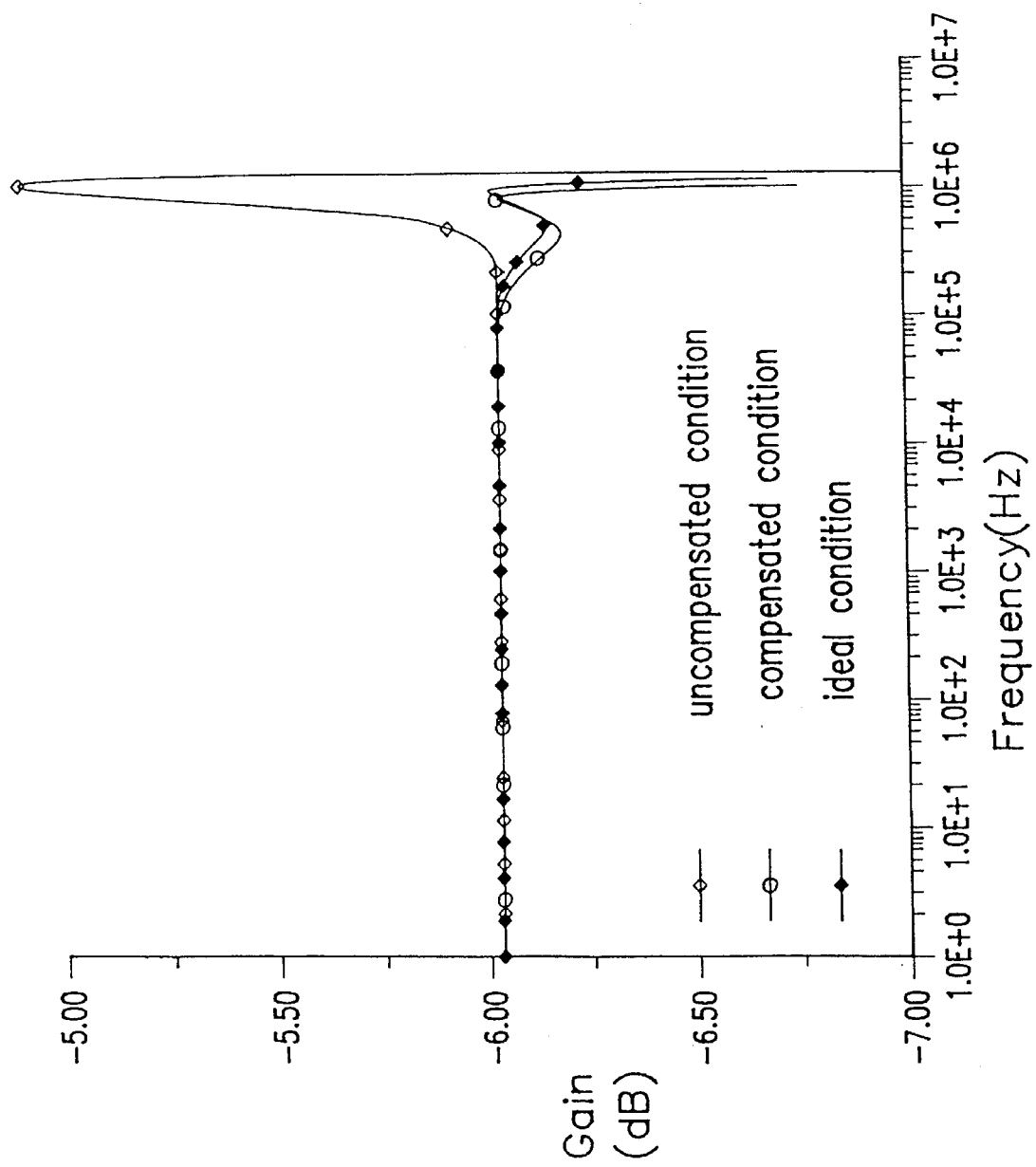
FIG. 6 shows a graph of the frequency response of a third-order, lowpass filter circuit in FIG. 5.

In addition to the above application, the differential-difference current conveyor can be applied to the implementation of a filter. FIG. 5 represents a third-order lowpass filter employing the differential-difference current conveyors. A signal flow graph method is used to design this third-order lowpass filter. This filter circuit comprises six differential-difference current conveyors (labeled as 40, 50, 60, 70, 80, and 90), three grounding capacitors (labeled as C4, C6, C8), and three MOS transistors (labeled as M51, M71, M91), whose gates are coupled to the reference voltage VG5. In addition, it further comprises three capacitors (labeled as C5, C7, C9), which are used to compensate for the high frequency effect of these MOS transistors and differential-difference current conveyors. This embodiment of the third-order lowpass filter is a general-purpose case and is not limited by the parameters of the components. The terminal 401 of the differential-difference current conveyor 40 receives the input signal VIN, which is the signal to be filtered. The terminal 80Z of the differential-difference current conveyor 80 outputs the filtered signal VO. The interconnections between these components are that the terminals 402, 40Z, and 601 are connected to the capacitor C4; the terminals 403, 60Z, and 801 are connected to the capacitor C6; the terminals 603, 802, and 80Z are connected to the capacitor C8. Further, the source-drain passages of MOS transistors (M51, M71, M91) are coupled between the second (502, 702, 902) and fourth (50X, 70X, 90X) input terminals, respectively. Further, the terminals 40X and 502 are connected to the capacitor C5; the terminals 60X and 702 are connected to the capacitor C7; and the terminals 80X and 902 are connected to the capacitor C9. The other terminals are grounded. The intrinsic parameters related to the capacitors (C4, C6, C8) and the MOS transistors (M51, M71, M91) can be controlled to modify the frequency response of this third-order lowpass filter.

In order to exhibit the property of this third-order lowpass filter, we performed a relatively accurate simulation to demonstrate the performance of this embodiment under certain conditions, such as uncompensated (without a compensation capacitor), compensated (with compensation capacitors) and an ideal case. In this embodiment, the ripple bandwidth is about 1 MHz and fluctuation is about 0.1 dB. It was found that the compensated case of this embodiment is quite close to the ideal one, although the uncompensated case has a spike of frequency response in the high band.

The differential-difference current conveyor and its applications have the advantages described below:

(1) The differential-difference current conveyor has superior high-frequency performance and therefore is appropriate for high-frequency circuits.

(2) The integrator circuit, which comprises the differential-difference current conveyor, requires only grounding capacitors instead of floating capacitors; and only grounding resistors or MOS transistors operated in the linear region instead of floating resistors. Such a situation is suitable for the manufacture of integrated circuits.

(3) A multiple-input integrator circuit can be easily implemented using the differential-difference current conveyor.

The forgoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A differential-difference current conveyor, wherein a voltage sum of a first input signal and a third input signal is substantially equal to a voltage sum of a second input signal and a fourth input signal, and a value of current of said fourth input signal is substantially equal to a value of current of an output signal, and values of current of said first, second, and third input signals are substantially zero, said differential-difference current conveyor comprising:

a high voltage source;

a low voltage source;

a first differential pair, wherein a non-inverting input terminal and an inverting input terminal of said first differential pair are coupled to said third input signal and to said second input signal, respectively;

a second differential pair, wherein a non-inverting input terminal and an inverting input terminal of said second differential pair are coupled to said fourth input signal and said first input signal, respectively, and a non-inverting output terminal and an inverting output terminal of said second differential pair are connected to an inverting output terminal and a non-inverting output terminal of said first differential pair, respectively;

a load connected between said high voltage source and the output terminals of said first differential pair and second differential pair;

means for negative feedback, connected to the non-inverting output terminal of said second differential pair and the non-inverting input terminal of said second differential pair; and a tracking means for tracking a current value of said fourth input signal and said output signal.

2. The differential-difference current conveyor as claimed in claim 1, wherein said first differential pair comprises:
a first MOS transistor, wherein a gate and a drain of said first MOS transistor serve as the non-inverting input terminal and the inverting output terminal of said first differential pair, respectively;
a second MOS transistor, wherein a gate and a drain of said second MOS transistor serve as the inverting input terminal and the non-inverting output terminal of said first differential pair, respectively, and a source of said second MOS transistor and a source of said first MOS transistor are interconnected as a 4 first common source terminal; and
a first current source which is coupled between said low voltage source and said first common source terminal.

3. The differential-difference current conveyor as claimed in claim 2, wherein said second differential pair comprises:
a third MOS transistor, wherein a gate and a drain of said third MOS transistor serve as the non-inverting input terminal and the inverting output terminal of said second differential pair, respectively;
a fourth MOS transistor, wherein a gate and a drain of said second MOS transistor serve as the inverting input terminal and the non-inverting output terminal of said second differential pair, respectively, and a source of said fourth MOS transistor and a source of said third MOS transistor are interconnected as a second common source terminal; and
a second current source which is coupled between said low voltage source and said second common source terminal.

4. The differential-difference current conveyor as claimed in claim 1, wherein said negative feedback means comprises a MOS transistor.

5. The differential-difference current conveyor as claimed in claim 1, wherein said tracking means comprises a current mirror to cause the value of current of said output signal to be substantially equal to the value of current of said fourth input signal.

6. An integrator circuit for integrating a sample signal, said integrator circuit comprising:
a differential-difference current conveyor comprising:
a first differential pair having a second input terminal and a third input terminal; and
a second differential pair having a first input terminal and a fourth input terminal, and
an output terminal connected to outputs of said first and second differential pairs, wherein said first and third input terminals are grounded, and said second input terminal receives said sample signal, and said output terminal outputs an integrated sample signal based on the input received by the second input terminal of said first differential pair;
a resistive means, connected between said second and fourth input terminals of said differential-difference current conveyor for serving as a linear resistor; and
a capacitor having one terminal grounded and another terminal connected to said output terminal.

7. The integrator circuit as claimed in claim 6, wherein said means for serving as a linear resistor is a MOS transistor operated in its linear region, wherein a gate of said MOS transistor is coupled to a reference voltage and a source-drain passage of said MOS transistor is connected between said second and fourth input terminals of said differential-difference current conveyor.

8. The integrator circuit as claimed in claim 6 further comprising a circuit connected between said second input terminal and ground.

9. An integrator circuit for integrating a combined signal of a first signal, a second signal, and a third signal, said integrator circuit comprising:
a differential-difference current conveyor comprising:
a first differential pair having a second input terminal and a third input terminal;
a second differential pair having a first input terminal and a fourth input terminal; and
an output terminal connected to outputs of said first and second differential pairs, wherein said first, second, and third input terminals are coupled to said first, second, and third signals, respectively, and said output terminal outputs the integrated signal based on the first signal input to the first terminal of said second differential pair and the second and third signals input to the first differential pair;
a load, which is grounded, connected to said fourth input terminal of said differential-difference current conveyor; and
a capacitor, which is grounded, connected to said output terminal.

10. The integrator circuit as claimed in claim 9, wherein said load is a resistor.

11. A third-order lowpass filter circuit for filtering a sample signal, said third-order lowpass filter circuit comprising:
first through sixth differential-difference current conveyors, each of said differential-difference current conveyors comprising:
a first differential pair having a second input terminal and a third input terminal;
a second differential pair having a first input terminal and a fourth input terminal; and
an output terminal connected to outputs of said first and second differential pairs, wherein in said first differential-difference current conveyor, said first input terminal receives said sample signal; in said second differential-difference current conveyor, said first input terminal, said third input terminal, and said output terminal are grounded; in said third differential-difference current conveyor, said second input terminal is grounded; in said fourth differential-difference current conveyor, said first input terminal, said third input terminal, and said output terminal are grounded; in said fifth differential-difference current conveyor, said third input terminal is grounded and said output terminal outputs the filtered sample signal resulting from said sample signal; in said sixth differential-difference current conveyor, said first input terminal, said third input terminal, and said output terminal are grounded;
a first MOS transistor, wherein a gate of said first MOS transistor is coupled to a reference voltage and a source-drain passage of said first MOS transistor is coupled between said second and fourth input terminals of said second differential-difference current conveyor;
a second MOS transistor, wherein a gate of said second MOS transistor is coupled to said reference voltage and a source-drain passage of said second MOS transistor is coupled between said second and fourth input terminals of said fourth differential-difference current conveyor;
a third MOS transistor, wherein a gate of said third MOS transistor is coupled to said reference voltage and a source-drain passage of said third MOS transistor is coupled between said second and fourth input terminals of said sixth differential-difference current conveyor;

a first capacitor, which is grounded, connected to the second terminal and the output terminal of said first differential-difference current conveyor and to the first input terminal of said third differential-difference current conveyor;

a second capacitor, which is grounded, connected to the third input terminal of said first differential-difference current conveyor, to the first input terminal of said fifth differential-difference current conveyor, and to the output terminal of said third differential-difference current conveyor; and a third capacitor, which is grounded, connected to the second input terminal and the output terminal of said fifth differential-difference current conveyor and to the third input terminal of said third differential-difference current conveyor.

12. The third-order lowpass filter as claimed in claim 11, further comprising a circuit wherein said circuit is connected to the second input terminal of said second differential-difference current conveyor.

13. The third-order lowpass filter as claimed in claim 11, further comprising a circuit, wherein said circuit is connected to the second input terminal of said fourth differential-difference current conveyor.

14. The third-order lowpass filter as claimed in claim 11, further comprising a circuit, wherein said circuit is connected to the second input terminal of said sixth differential-difference current conveyor.

15. A differential-difference current conveyor, wherein said differential-difference current conveyor accepts a first input signal, a second input signal, a third input signal, and a fourth input signal and produces an output signal, said differential-difference current-conveyor comprising:

a first differential pair, wherein a non-inverting input terminal and an inverting input terminal of said first differential pair are coupled to said third input signal and to said second input signal, respectively;

a second differential pair, wherein a non-inverting input terminal and an inverting input terminal of said second differential pair are coupled to accept said fourth input signal and said first input signal, respectively, and a non-inverting output terminal and an inverting output terminal of said second differential pair are connected to an inverting output terminal and a non-inverting output terminal of said first differential pair, respectively;

a load connected between the output terminals of said first differential pair and second differential pair and a terminal for connection to a voltage source;

means for negative feedback, connected to the non-inverting output terminal of said second differential pair and the non-inverting input terminal of said second differential pair; and a tracking means for tracking a current value of said fourth input signal and said output signal.

* * * * *